(12) United States Patent
Yin et al.

(10) Patent No.: US 7,863,194 B2
(45) Date of Patent: Jan. 4, 2011

(54) IMPLANTATION OF MULTIPLE SPECIES TO ADDRESS COPPER RELIABILITY

(75) Inventors: Heyun Yin, Saugus, MA (US); George D. Papasouliotis, North Andover, MA (US); Vikram Singh, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/760,249

(22) Filed: Apr. 14, 2010

(65) Prior Publication Data

US 2010/0240201 A1 Sep. 23, 2010

Related U.S. Application Data

(62) Division of application No. 12/255,181, filed on Oct. 21, 2008, now Pat. No. 7,737,013.

(51) Int. Cl.
*H01L 21/00* (2006.01)

(52) U.S. Cl. ............... 438/687; 438/527; 438/627; 438/628; 438/655; 257/E21.584

(58) Field of Classification Search ......... 438/527–528, 438/630, 627–628, 642–644, 653–655, 664, 438/682, 687; 257/E21.584
See application file for complete search history.

(56) References Cited

U.S. PATENT DOCUMENTS 7,745,282 B2 * 6/2010 Yang et al. ............ 438/250

\* cited by examiner

*Primary Examiner*—Thanhha Pham

(57) ABSTRACT

A first species and a second species are implanted into a conductor of a substrate, which may be copper. The first species and second species may be implanted sequentially or at least partly simultaneously. Diffusion of the first species within the conductor of the substrate is prevented by the presence of the second species. In one particular example, the first species is silicon and the second species is nitrogen, although other combinations are possible.

8 Claims, 7 Drawing Sheets

IMPLANTATION OF MULTIPLE SPECIES TO ADDRESS COPPER RELIABILITY

CROSS-REFERENCE TO RELATED APPLICATIONS

This application is a divisional of the nonprovisional patent application entitled "Implantation of Multiple Species to Address Copper Reliability" filed Oct. 21, 2008 and assigned U.S. application Ser. No. 12/255,181, which claims priority to the provisional patent application entitled "Implantation of Multiple Species to Address Copper Reliability" filed Nov. 6, 2007 and assigned U.S. Application No. 60/985,749, both of which are hereby incorporated by reference.

FIELD

This disclosure relates to the implantation of species, and more particularly to the implantation of species to improve electromigration, line resistance, and reliability in a semiconductor device.

BACKGROUND

As feature sizes on semiconductor devices shrink, increased current density is required in the conductive lines. However, use of a high current density in these devices is limited because of electromigration in conductors, such as copper. Electromigration is the transport of material in a conductor caused by gradual movement of atoms or ions due to the momentum transfer between conducting electrons and the atoms or ions. Momentum from a moving electron may transfer to a nearby atom or ion and cause it to move from its original position. Over time, a large number of these atoms or ions may be moved, decreasing the reliability of electrical circuits.

Electromigration may cause gaps, breaks, increased line resistance, and excess heating in a semiconductor device. A gap or break in the conducting material or an unintended electrical connection may form when a number of atoms or ions move. Formation of such a gap or break may prevent the flow of electrons. Unintended connections may cause the device to malfunction.

Furthermore, as the conductive line-widths decrease, line resistance increases. Line resistance is the resistance across the length of a conductive layer having, for example, a rectangular cross-section. This may be represented by the equation:

$$R = \rho(L/wt)$$

In this equation, R is the line resistance in ohms per nm, $\rho$ is the film resistivity in ohms, L is the length of the conductor in nm, w is the width of the conductor in nm, and t is the thickness of the conductor in nm. High current density and resistance at a particular point in the conductor also may generate heat that may cause the breakdown of the conductor. Any imperfections in the crystal lattice may cause electrons flowing through the conductor to scatter rather than pass through the crystal lattice without collisions. Scattering of electrons will cause atoms in the crystal lattice to vibrate farther from an ideal position in the crystal lattice and, consequently, will increase resistance in the conductor. This increased resistance may lead to joule heating, or heat released when a current passes through a conductor, and undesirable losses in the semiconductor device.

Even grains within the conductive layers of a semiconductor structure may begin to move due to electromigration. Grain boundaries lack the symmetry and uniformity of a normal crystal lattice, causing momentum from the electrons to be transferred to the atoms or ions in the crystal lattice more strongly. Metal ions near the grain boundary are more weakly bonded than in the normal crystal lattice, so atoms may become separated and be transported in the direction of the current. The atoms may tend to move along the grain boundary. Such movement may change the grains in the semiconductor structure.

Electromigration may decrease the reliability of circuits or devices, such as a complimentary metal oxide semiconductor (CMOS). As the structures or feature sizes of a semiconductor device shrink, the effects caused by electromigration increase because power density and current density will increase. Furthermore, as semiconductor devices or integrated circuits (ICs) become more complex, individual parts or components must become more reliable for the entire semiconductor device or IC to function properly. Electromigration can lead to failures of the individual parts or components, reducing the lifetime of the semiconductor device or IC. This is one reason it is important to control or reduce electromigration in a conductor.

Many techniques have been employed to improve copper electromigration. One provides capping layers at the top of a metal line. The capping layers may include CoWP/CoWB or SiCN. Another method is alloying the copper line with CuAl or CuMn. Lastly, ion and gas cluster implantation of a single species into the copper layer has been performed to modify the surface structure of the copper layer to improve adhesion or electric properties. None of these methods, however, reduce line resistance and prevent electromigration at the same time. Accordingly, there is a need for improved methods to reduce electromigration in a conductor, and, more specifically, to reduce electromigration while not substantially increasing the line resistance.

SUMMARY

According to a first aspect of the invention, a method of reducing electromigration is provided. The method comprises providing a substrate with a conductive layer. A first species is implanted into the conductive layer. The first species is selected from the group consisting of germanium, phosphorus, arsenic, boron, and bromine. A second species is implanted into the conductive layer. A compound comprising the first species and the second species is formed to reduce diffusion of the first species in the conductive layer.

According to a second aspect of the invention, a method of reducing electromigration is provided. The method comprises providing a substrate with a copper layer. Silicon ions are implanted into the copper layer to a first depth. Nitrogen ions are implanted into the copper layer to a second depth, the second depth being deeper than the first depth. Diffusion of the silicon ions in the copper layer is reduced by forming a compound comprising silicon and nitrogen.

According to a third aspect of the invention, a method of reducing electromigration is provided. The method comprises providing a substrate with a copper layer. Silicon ions, carbon ions, and nitrogen ions are implanted into the copper layer. A $Si_xN_yC_z$ compound is formed in the copper layer of the substrate. Diffusion of at least one of the silicon ions, the carbon ions, and the nitrogen ions is reduced in the copper layer by forming the $Si_xN_yC_z$ compound in the copper layer.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
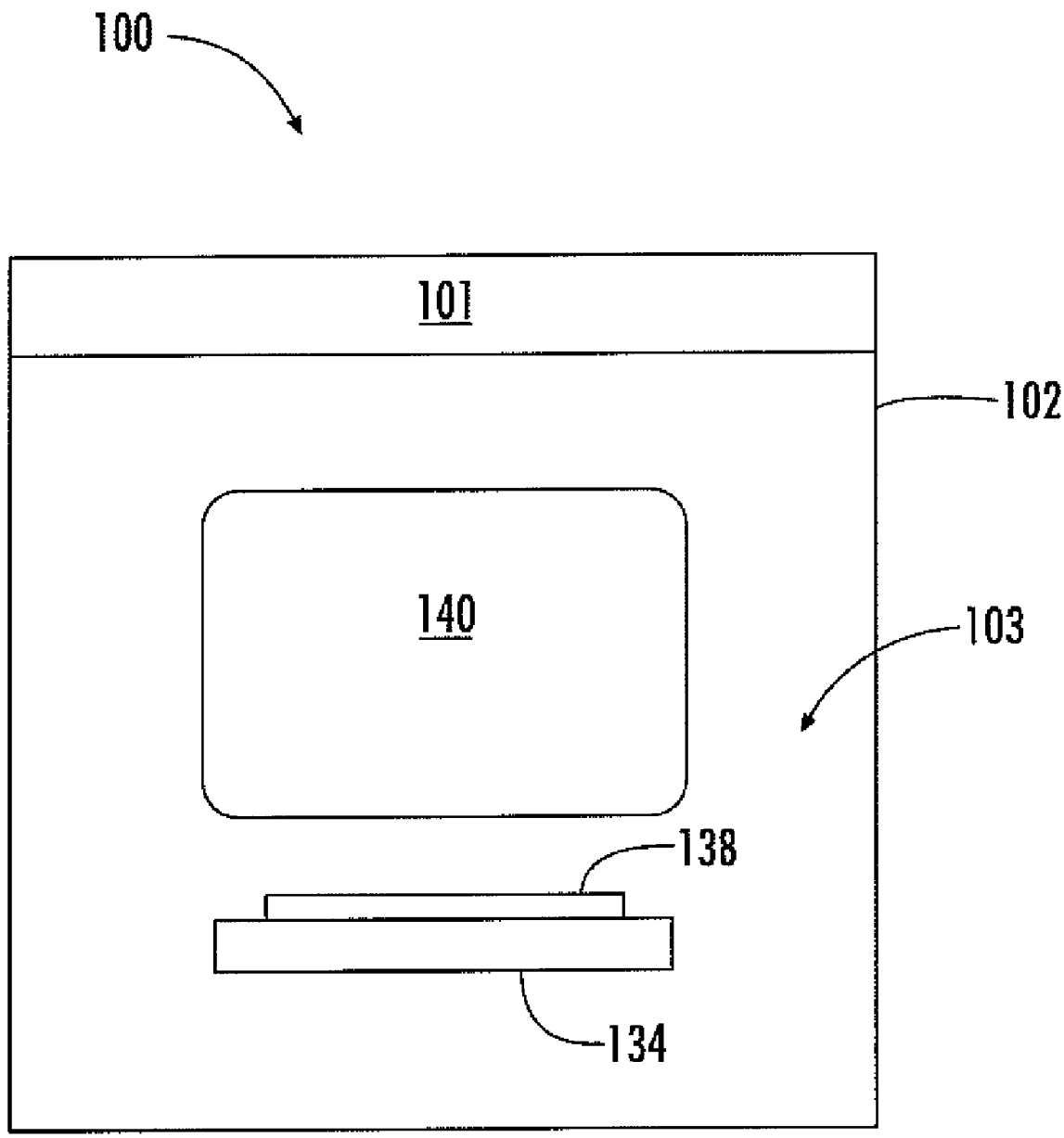
FIG. 1 is a block diagram of a plasma doping system.
Figure 2:
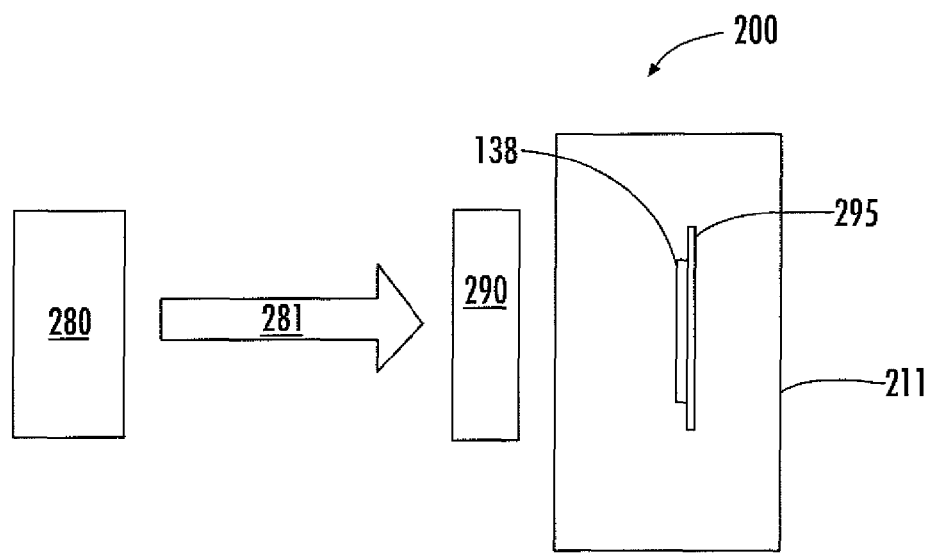
FIG. 2 is a block diagram of a beamline ion implanter.

In general, the present disclosure is directed at implanting a species into a conductor, such as copper. FIG. 1 is a block diagram of a plasma doping system 100. FIG. 2 is a block diagram of a beamline ion implanter 200. Those skilled in the art will recognize that the plasma doping system 100 and the beamline ion implanter 200 are each only one of many examples of differing plasma doping systems and beamline ion implanters. Furthermore, those skilled in the art will recognize apparatuses, such as other plasma immersion, plasma flood, or high-density plasma (HDP) chemical vapor deposition (CVD) tools, that also may be used for implanting a species into a conductor.

Turning to FIG. 1, the plasma doping system 100 includes a process chamber 102 defining an enclosed volume 103. The process chamber 102 or workpiece 138 may be cooled or heated by a temperature regulation system (not illustrated). A platen 134 may be positioned in the process chamber 102 to support a workpiece 138. The platen 134 also may be cooled or heated by a temperature regulation system (not illustrated). In one instance, the workpiece 138 may be a semiconductor wafer having a disk shape, such as, in one embodiment, a 300 mm diameter silicon wafer. However, the workpiece 138 is not limited to a silicon wafer. The workpiece 138 could also be, for example, a flat panel, solar, or polymer substrate. The workpiece 138 may be clamped to a flat surface of the platen 134 by electrostatic or mechanical forces. In one embodiment, the platen 134 may include conductive pins (not shown) for making connection to the workpiece 138.

An implant gas is provided to process chamber 102 at a desired pressure. The plasma doping system 100 further includes a source 101 configured to generate a plasma 140 from the implant gas within the process chamber 102. The source 101 may be an RF source or other sources known to those skilled in the art. The platen 134 may be biased. This bias may be provided by a DC or RF power supply. The plasma doping system 100 may further include a shield ring, a Faraday sensor, or other components. In some embodiments, the plasma doping system 100 is part of a cluster tool, or operatively-linked plasma doping chambers within a single plasma doping system 100. Thus, numerous plasma doping chambers may be linked in vacuum.

In operation, the source 101 is configured to generate the plasma 140 within the process chamber 102. In one embodiment, the source is an RF source that resonates RF currents in at least one RF antenna to produce an oscillating magnetic field. The oscillating magnetic field induces RF currents into the process chamber 102. The RF currents in the process chamber 102 excite and ionize the implant gas to generate the plasma 140. The bias provided to the platen 134, and, hence, the workpiece 138, will accelerate ions from the plasma 140 toward the workpiece 138 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Turning to FIG. 2, a block diagram of a beamline ion implanter 200 is illustrated. Again, those skilled in the art will recognize that the beamline ion implanter 200 is only one of many examples of beamline ion implanters. In general, the beamline ion implanter 200 includes an ion source 280 to generate ions that are extracted to faun an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as workpiece 138, in the path of the ion beam 281 such that ions of the desired species are implanted into workpiece 138. In one instance, the workpiece 138 may be a semiconductor wafer having a disk shape, such as, in one embodiment, a 300 millimeter (mm) diameter silicon wafer. However, the workpiece 138 is not limited to a silicon wafer. The workpiece 138 could also be, for example, a flat panel, solar, or polymer substrate. The end station 211 may include a platen 295 to support the workpiece 138. The end station 211 also may include in one embodiment a scanner (not shown) for moving the workpiece 138 perpendicular to the long dimension of the ion beam 281 cross-section, thereby distributing ions over the entire surface of workpiece 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

Figure 3:
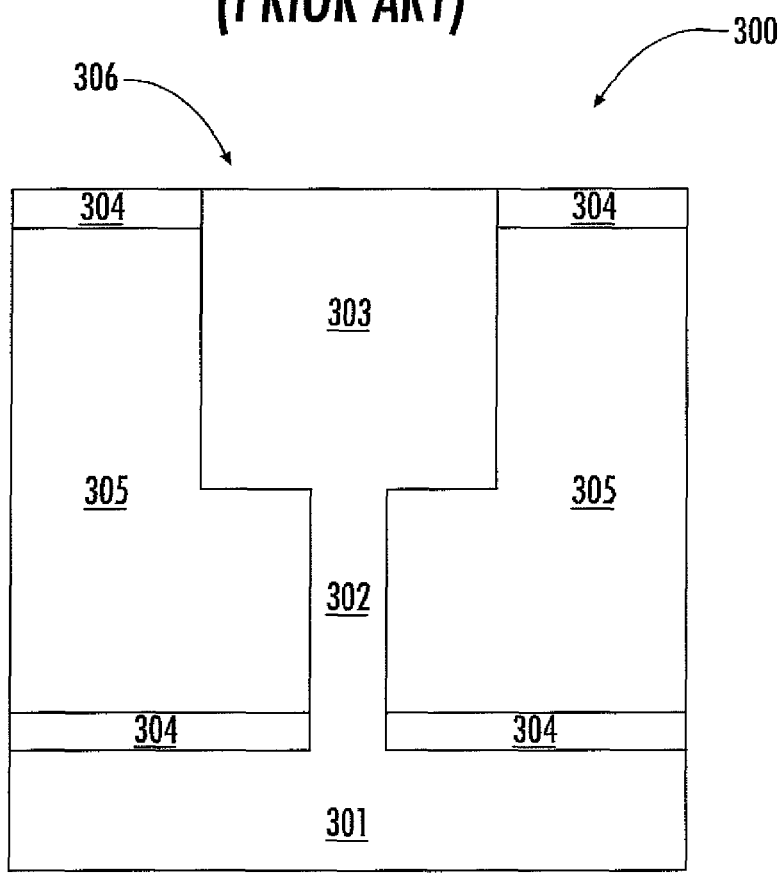
FIG. 3 is a cross-section of an exemplary damascene structure.

FIG. 3 is a cross-section of an exemplary damascene structure. One skilled in the art will recognize that embodiments of the process described herein may be applied to other semiconductor structures or other conductor layers. The damascene structure 300 is only one of many examples. This exemplary damascene structure 300 includes a first conductor 303, second conductor 301, and via 302. The first conductor 303, second conductor 301, and via 302 in this particular embodiment are copper, although other metal or conductor compositions are possible. The first conductor 303, second conductor 301, and via 302 are surrounded by a low-k dielectric 305 and a capping layer 304.

One problem with the damascene structure 300 may be electromigration, especially at the interface of the first conductor 303 and another layer or region. One such interface is the top surface 306 of the first conductor 303, which may contact a capping layer in one embodiment. One theory states that electrons move faster at the top surface 306 than elsewhere in the first conductor 303 when a voltage is applied due to grain boundary scattering. This grain boundary scattering means that electrons scatter when the electrons flow into imperfections in the crystal lattice and cause an increase in resistance. Increased resistance in the first conductor 303 may lead to more electromigration. Therefore, faster electrons at the top surface 306 may lead to more electromigration. This electromigration at the top surface 306 may cause voids or failures to form in, for example, the first conductor 303 when atoms are transported within the first conductor 303. If a capping layer is later added on top of the top surface 306, the momentum transfer to atoms caused by the moving electrons ("electron wind force") will be reduced because the capping layer will prevent movement of atoms at the top surface 306. Electromigration will likewise be reduced because resistance will not be increased.

Another problem with damascene structure 300 may be line resistance. Dopants in the first conductor 303 of the damascene structure 300 will migrate deeper into the copper. This may be at least partly due to the interactions with electrons during electromigration. Increase line resistance may be caused by this migration or transport because increased electromigration leads to increased resistivity in the first conductor 303.

In some embodiments, multiple damascene structures 300 may be arranged in series or in close proximity to each other. In these embodiments, damascene structures 300 may have leakage problems between the various damascene structures 300 because of unintended connections caused by electromigration. These leakage problems also may be caused by damage to the low-k dielectric 305. Leakage problems may cause one or more of the damascene structure 300 to fail.

Figure 4A:
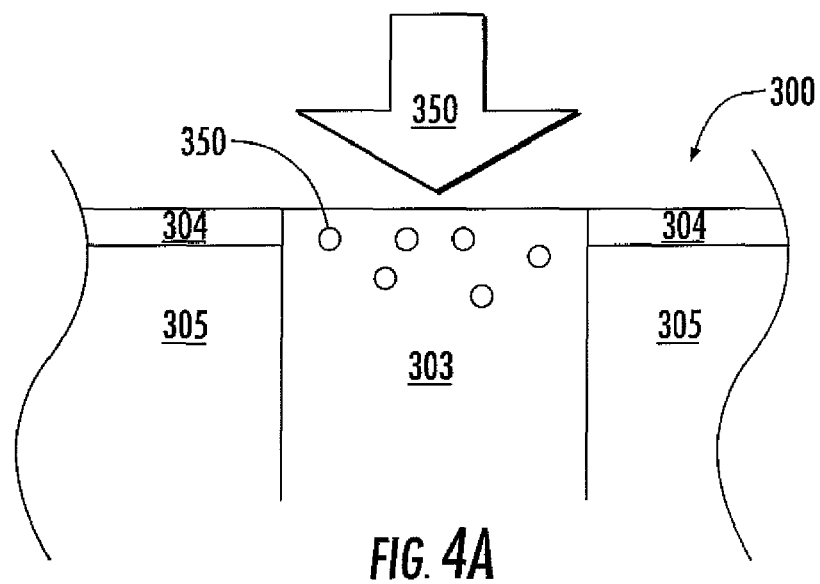
FIGS. 4A-C illustrate implantation of a first and second species within the damascene structure of FIG. 3.
Figure 4B:
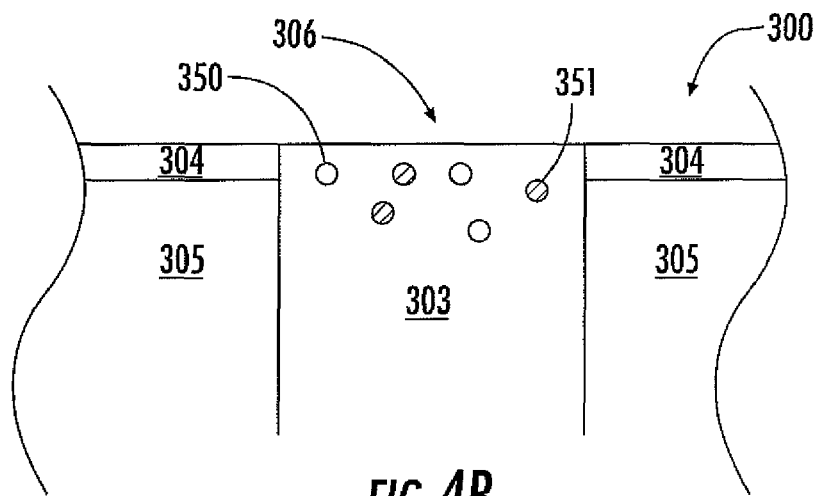
Figure 4C:
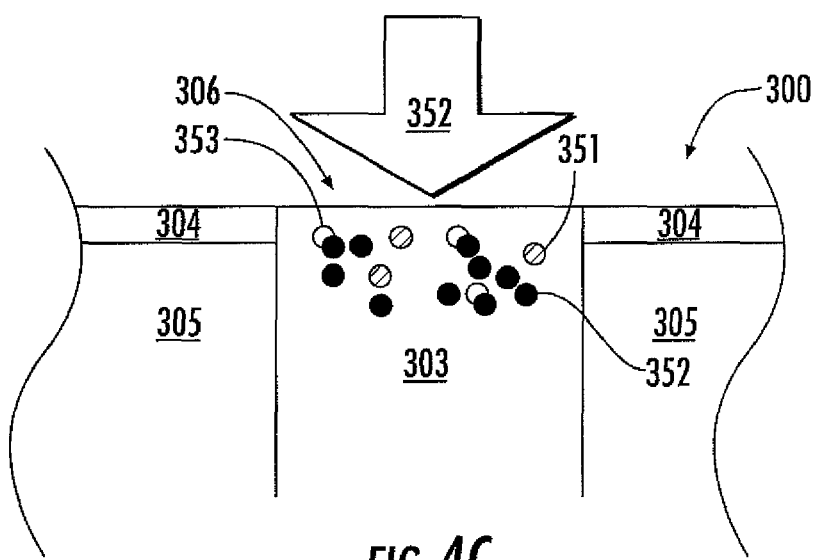

FIGS. 4A-C is an embodiment of the implantation of a first and second species within the damascene structure of FIG. 3. In FIG. 4A, a first species 350 is implanted. This first species 350 enters the structure of the first conductor 303. The first conductor 303 is copper in this particular embodiment, although other conductors are possible. As illustrated in FIG. 4B, some of the first species 350 will bond with metal atoms (not illustrated) in the first conductor 303, forming a first species-metal species compound 351.

This first species-metal species compound 351 will reduce or control electromigration in the first conductor 303 and improve interface control of the metal atoms near the top surface 306 of the first conductor 303. The interface control is attained by changing the resistivity in the first conductor 303 through implantation of the first species 350 and formation of the first species-metal species compound 351. In one embodiment, this implant may be configured to not extensively damage the crystal lattice of the top surface 306, but rather to predominantly affect the first species 350 levels in the first conductor 303. Damage to the crystal lattice of the top surface 306 may affect bond strength between the first conductor 303 and any capping layer.

Not all the first species 350 will bond with the metal atoms of the first conductor 303. As illustrated in FIG. 4C, a second species 352 also is implanted. Some of the second species 352 will bond with the excess first species 350 to form a first species-second species compound 353. Creating the reaction product of the first species-second species compound 353 will reduce excess first species 350 in the first conductor 303.

The presence of this second species 352 or the existence of the first species-second species compound 353 will reduce or control the diffusion of at least the excess first species 350 in the metal of the first conductor 303 due to electromigration. A first species-second species compound 353 is less prone to electromigration than only the excess first species 350. Thus, the second species 352 may be a diffusion retarding species because it reduces or controls diffusion.

Due to the reduction in electromigration, copper line resistance and other reliability issues may be mitigated. The reduction of electromigration may reduce the formation of narrow lines or grains in the copper layer that the current is forced in. This also may reduce joule heating within the damascene structure 300.

The first species 350 and second species 352 may come from the plasma doping system 100 of FIG. 1 or the beamline ion implanter 200 of FIG. 2, although the first species 350 and second species 352 could also come from other sources.

Figure 5:
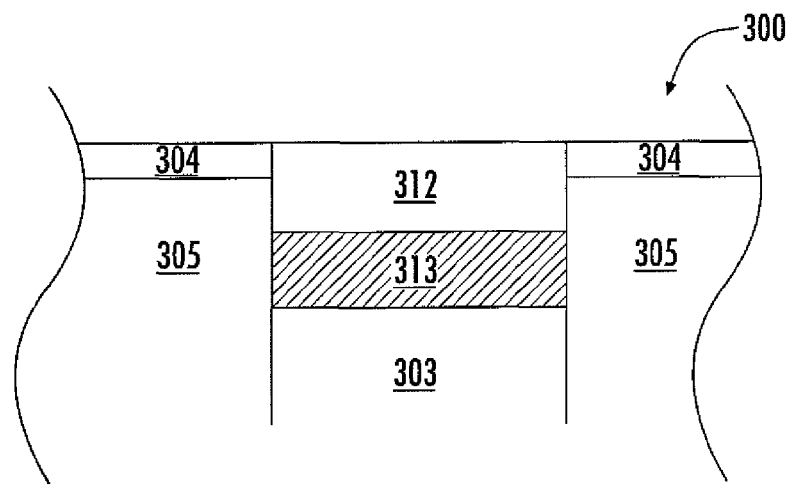
FIG. 5 is the damascene structure of FIG. 3 during implantation in a first embodiment.

FIG. 5 is the damascene structure of FIG. 3 during implantation in a first embodiment. Region 312 of the first conductor 303 is implanted with a first species. In this particular embodiment, the first species is silicon and the first conductor is copper. The first species may reduce or control electromigration in the copper and will bond with the copper to form a copper-first species compound. Implanting the first species also may provide improved interface control of the copper in the damascene structure 300, thereby mitigating electromigration. The first species adheres to the surface and sub-surface of the copper in the damascene structure 300, forming the region 312.

A second species is implanted into the damascene structure 300 after or at least partly during the implant of the first species, but in an alternate embodiment, the second species is implanted at least partly prior to the implant of the first species. In this particular embodiment, the second species is nitrogen. The second species scavenges any excess first species that was not fully consumed by the copper in the damascene structure 300. Thus, any excess first species and the second species react to form a first species-second species compound. This second species also will exist in the surface and sub-surface of the copper of damascene structure 300. In this particular embodiment, the second species is implanted to a depth greater than the depth of the first species implant. This is represented by a region 313. Region 313 may encompass or overlap with region 312 in one embodiment.

Figure 6:
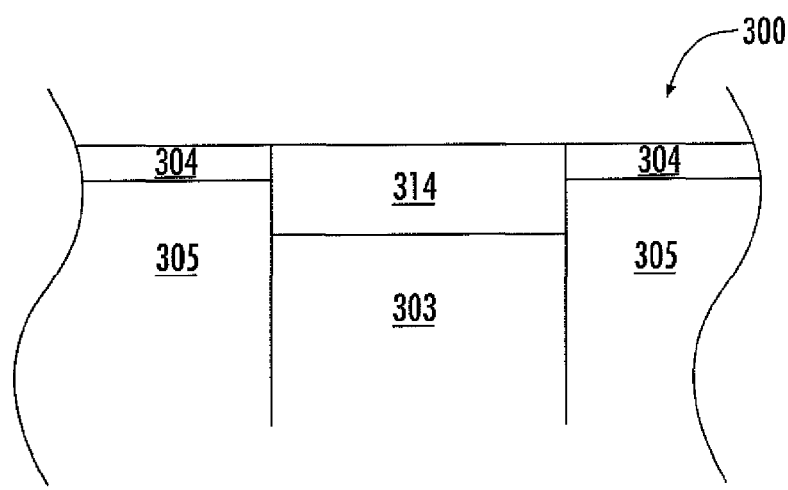
FIG. 6 is the damascene structure of FIG. 3 during implantation in a second embodiment.

FIG. 6 is the damascene structure of FIG. 3 during implantation in a second embodiment. A first species is implanted into the first conductor 303 damascene structure 300. In this particular embodiment, the first conductor 303 is copper and the first species is germanium, phosphorus, arsenic, boron, or bromine, for example. The first species may reduce or control electromigration in the copper and will bond with the copper to form a copper-first species compound. Implanting the first species also may provide improved interface control of the copper in the damascene structure 300, thereby mitigating electromigration.

A second species is implanted into the damascene structure 300 after or at least partly during the implant of first species, but in an alternate embodiment, the second species is implanted at least partly prior to the implant of the first species. In this particular embodiment, the second species is nitrogen, fluorine, carbon, sulfur, hydrogen, or a noble gas. The second species scavenges any excess first species that was not fully consumed by the copper in the damascene structure. Thus, any excess first species and the second species react to form a first species-second species compound.

The first species and second species will exist in the surface and sub-surface of the copper of damascene structure 300. In this particular embodiment, the first species and the second species are implanted to approximately the same depth of the copper in the damascene structure 300, which is represented by the region 314. However, in another embodiment, the first species and second species are implanted to different depths within the copper of the damascene structure 300. For example, the second species may be implanted to a depth greater than the depth of the first species implant as illustrated in FIG. 5.

The dopant profile of either the first species or second species may be modified by changing the process conditions of the plasma doping system 100 of FIG. 1 or the beamline ion implanter 200 of FIG. 2. In a plasma doping system 100, this may include pressure, RF power, bias energy, gas flow, workpiece temperature, energy mixture dilution, or duty cycle. In a beamline ion implanter 200, this may include beam energy, beam dose, beam current, or workpiece temperature.

One particular embodiment of the process explained herein is the implantation of HBr with an inert gas, such as, for example, hydrogen, helium, or argon. Bromine radicals are implanted into a conductor, such as copper, in the damascene structure 300 to form $CuBr_x$ near the surface and sub-surface. The hydrogen, helium, or argon will remove excess bromine by forming a bromine compound and will prevent diffusion or migration of the bromine within the conductor of the damascene structure 300.

Another particular embodiment of the process explained herein is the implantation of $B_xH_y$ and $N_z$ into a conductor, such as copper, in the damascene structure 300. After the implantation of these two species, a $B_xN_y$ compound is formed with any excess boron that was not fully consumed by the copper. Thus, a $B_xN_y$ layer is formed near the surface or sub-surface of the damascene structure 300 and prevents diffusion or migration of the boron within the conductor of the damascene structure 300.

One particular embodiment of the process explained herein involves the at least partly simultaneous implantation of Si, C, and N. To form these radicals, $N_2$, $NH_3$, $SiH_4$, $Si_2H_6$, $CH_4$, alkanes of the formula $C_nH_{2n+2}$, alkenes, alkines, or organosilicon compounds such as $Si_xH_yC_z$ may be used, for example. These radicals are implanted into a conductor, such as copper, in the damascene structure 300 to form $Si_xN_yC_z$ compounds through silicidation, nitridation, or carbonization reactions. Thus, a layer of $Si_xN_yC_z$ is formed near the surface and sub-surface of the damascene structure 300. This will prevent diffusion or migration of the species within the conductor of the damascene structure 300

In another embodiment, silicon-containing, carbon-containing, and nitrogen-containing gases may be introduced sequentially. These sequential implants may be performed in a plasma doping system 100, a beam-line ion implanter 200, or both a plasma doping system 100 and a beamline ion implanter 200. Thus, a silicon-containing compound, carbon-containing compound, and nitrogen-containing compound are all introduced sequentially in some embodiments.

Implantation of the first species 350 and the second species 352 may be either at least partly simultaneous or at least partly sequential. Additional species than those listed also may be implanted either at least partly simultaneously or at least partly sequentially. In one particular embodiment, a third species is implanted with the first species 350 and the second species 352. For example phosphorus may be implanted with silicon and nitrogen.

Furthermore, while certain atoms or elements are listed for the first species 350 or second species 352, the compound ionized may be in molecular form. Some examples of these molecular species may include, for example, $H_2S$, $CH_4$, $CF_4$, $NF_2$, $SiF_4$, or HBr. These may form complex compounds that can address electromigration, line resistance, or reliability issues. Electromigration may be further reduced and any conductor line resistance increase may be reduced through use of these species. In yet another embodiment, more two or more different first species or two or more different second species may be implanted. For example, silicon-containing, carbon-containing, sulfur-containing, and nitrogen-containing gases are introduced at least partly simultaneously in a plasma doping system 100 in one embodiment. The implantation process occurs after the plasma is ignited and stabilized.

Some embodiments may use both simultaneous and sequential implantation wherein certain species are introduced at least partly simultaneously while others are introduced in sequence either before or after the at least partly simultaneous implantation. Furthermore, some of these embodiments use both a plasma doping system 100 and a beamline ion implanter 200 for implantation, rather than just one or the other.

In other embodiments, a substrate surface preparation step is performed prior to implanting a first species 350 and second species 352. The top surface 306 of the damascene structure 300 may be reduced using reducing radicals, such as $NH_3$ or $H_2$. This may be used to clean the substrate or top surface 306 of the damascene structure 300 and may remove surface contaminants before further implantation. Other embodiments in a plasma doping system 100 include a hydrogen reduction step of the conductor in the damascene structure 300 prior to implanting a first species 350 and second species 352.

In another embodiment, the surface of the damascene structure 300 is cleaned prior to implanting a first species 350 and second species 352. This may be, in one instance, a wet clean step.

In yet another embodiment, the substrate surface preparation includes a cleaning step after the implantation of the first species 350 and second species 352. This particular cleaning step may involve sputtering or a wet clean.

Figure 7:
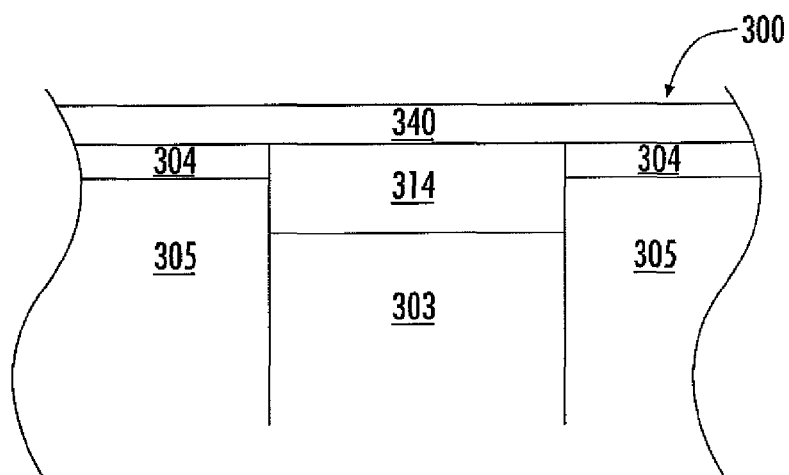
FIG. 7 is the damascene structure of FIG. 3 with a capping layer.

FIG. 7 is the damascene structure of FIG. 3 with a capping layer. Capping the conductive layers in the damascene structure 300 with a capping layer 340 may prevent leakage between multiple damascene structures 300 or reduce electromigration. The capping layer 340 may be, for example, such as SiCN, SiN, or SiOCH. In one instance, the capping layer 340 and the species implanted into damascene structure 300 may both be selected to address leakage. The embodiment illustrated in FIG. 7 places the capping layer 340 on damascene structure 300 after implantation of the first and second species into region 314 is complete. In an alternate embodiment, the capping layer 340 may be an at least partly simultaneous implant or deposition with the implantation of the first species or second species. This capping layer 340 will prevent corrosion of the conductor in the damascene structure 300. The capping layer 340 may be removed through a cleaning process, such as a DI water rinse or a light chemical mechanical polish (CMP) scrubber.

Figure 8A:
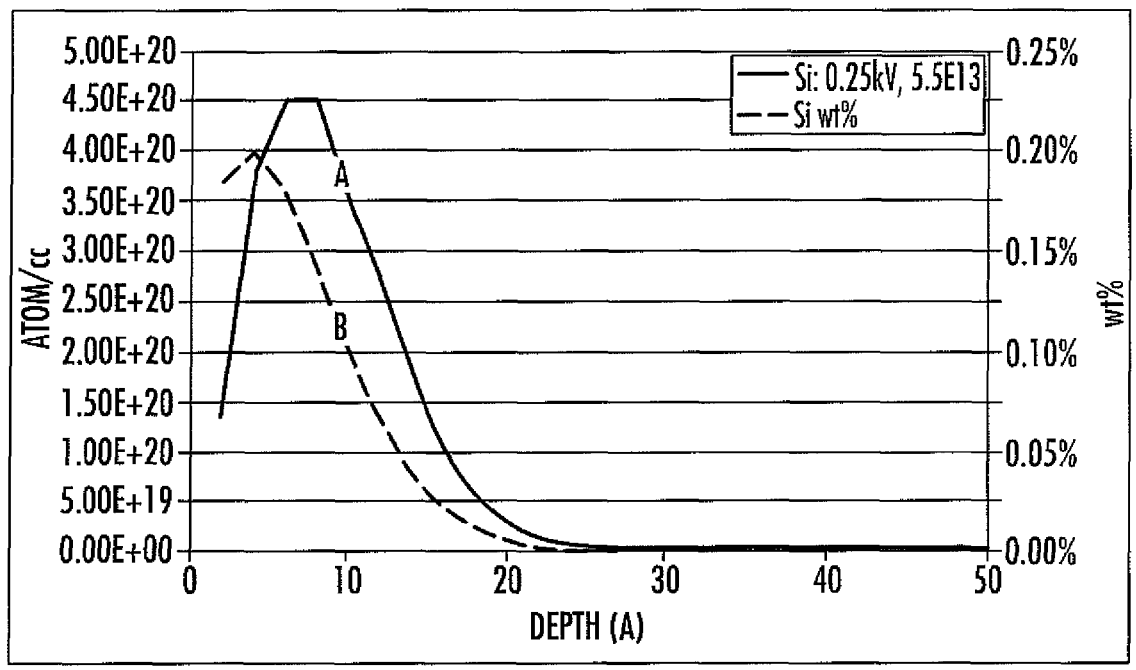
FIGS. 8A-8C are a series of graphs showing impurity distribution and concentration.
Figure 8B:
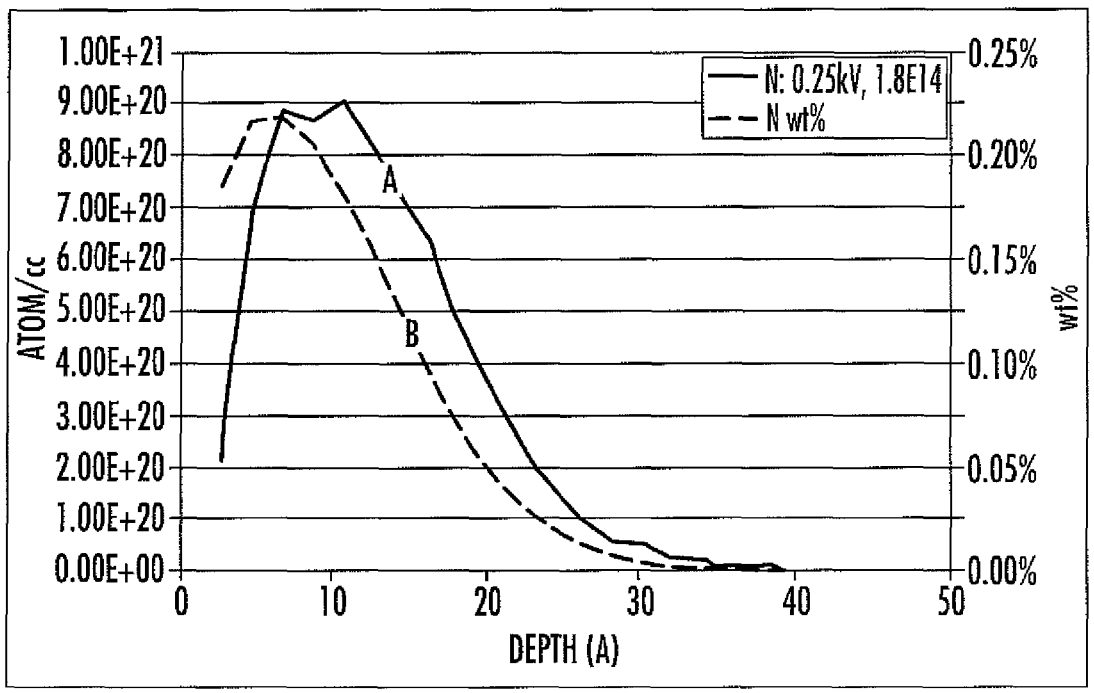
Figure 8C:
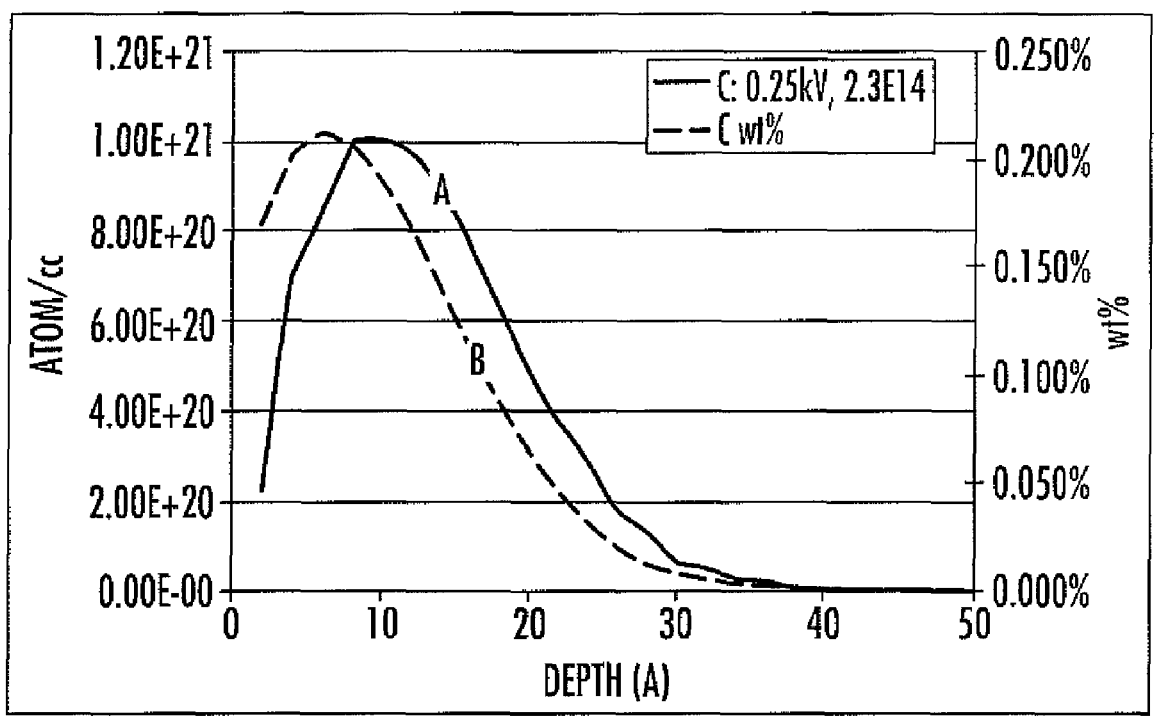

FIGS. 8A-8C are a series of graphs showing impurity distribution and concentration. Use of a plasma doping system 100 or a beamline ion implanter 200 for the embodiments of the process described herein has advantages over a CVD tool. These advantages may include precisely-controlled dopant depth profile or impurity concentration, the accurate placement of a species, or the accurate dosimetry and resulting stoichiometry. Shallow surface implants are possible by modulating either implant energy or implant dose. Furthermore, surface modification by a plasma doping system 100 or a beamline ion implanter 200 may not affect metal line resistance, capacitance, or line leakage. FIGS. 8A-8C demonstrate possible dopant profiles over the depth of the implant into a workpiece. The dopant concentrations for the species may be at the same or different depths. The dopant concentrations for the species also may be at the surface or have a retrograde profile. Some dopant concentrations for the species may form a box-like profile. FIG. 8A illustrates one example of a dopant profile for silicon. FIG. 8B illustrates one example of a dopant profile for nitrogen. FIG. 5C illustrates one example of a dopant profile for carbon. The line in FIGS. 8A-8C marked A is a concentration and the line marked B is a weight percent.

Figure 9:
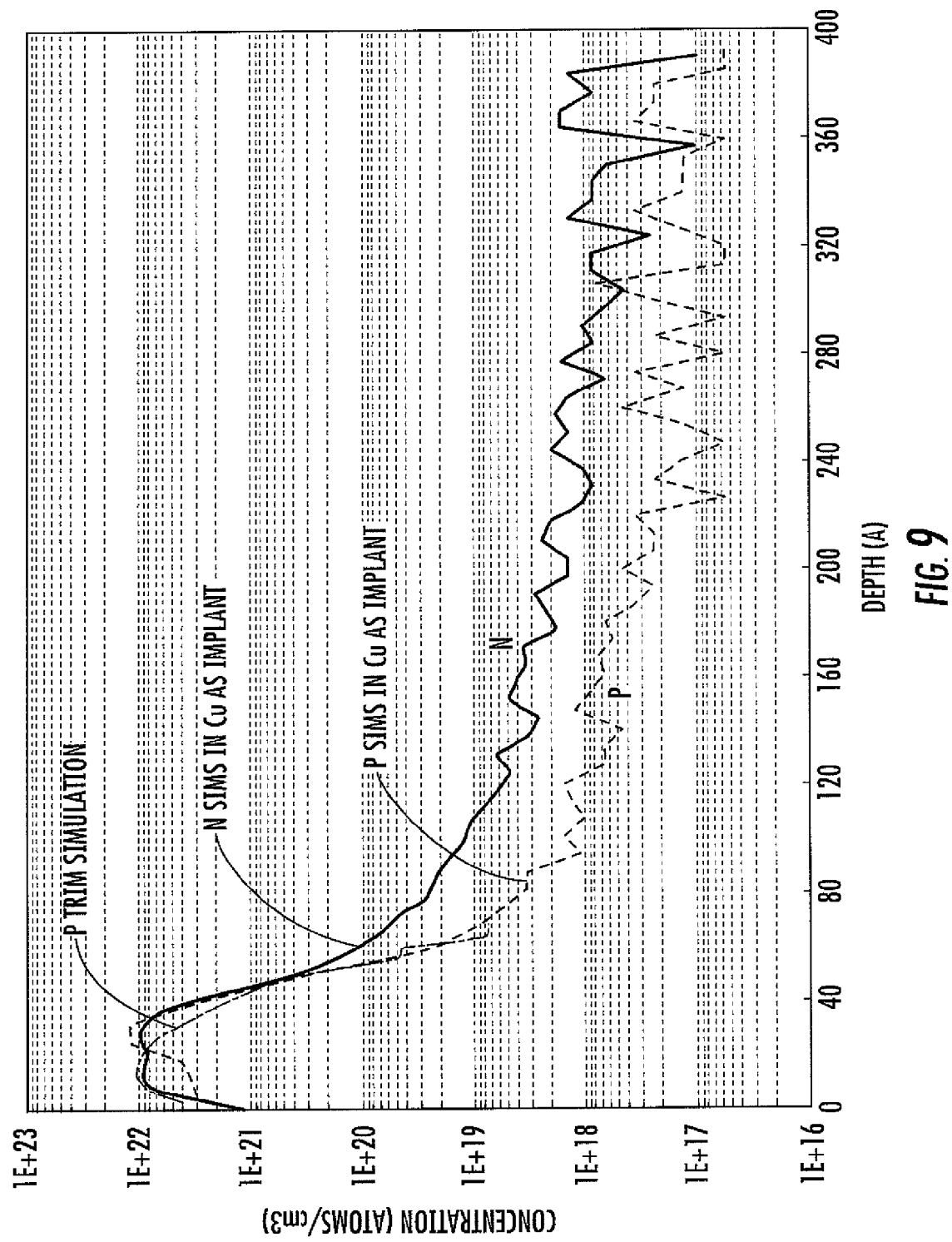
FIG. 9 is a graph comparing concentration versus depth for phosphorus and nitrogen.

FIG. 9 is a graph comparing concentration versus depth for phosphorus and nitrogen. In this particular example, both the phosphorus and nitrogen have retrograde profiles near the surface of the substrate. As illustrated in FIG. 9, the phosphorus and nitrogen concentrations may be placed at similar depths in the substrate.

The terms and expressions which have been employed herein are used as terms of description and not of limitation. There is no intention, in the use of such terms and expressions, of excluding any equivalents of the features shown and described (or portions thereof), and it is recognized that various modifications are possible. Other modifications, variations, and alternatives are also possible. Accordingly, the foregoing description is by way of example only and is not intended as limiting.

What is claimed is:

1. A method of reducing electromigration comprising:
   providing a substrate with a copper layer;
   implanting silicon ions into said copper layer to a first depth;
   implanting nitrogen ions into said copper layer to a second depth, said second depth being deeper than said first depth; and
   reducing diffusion of said silicon ions in said copper layer by forming a compound comprising silicon and nitrogen.

2. The method of claim 1, wherein said silicon ions are implanted prior to said nitrogen ions.

3. The method of claim 1, wherein said silicon ions and said nitrogen ions are implanted at least partially simultaneously.

4. The method of claim 1, further comprising reducing said copper layer with reducing radicals prior to implanting said silicon ions.

5. The method of claim 1, further comprising cleaning said substrate.

6. The method of claim 1, further comprising capping said substrate with a capping layer.

7. The method of claim 1, further comprising selecting a dose of said nitrogen ions, said dose configured to scavenge excess of said silicon ions to form said compound.

8. The method of claim 1, further comprising implanting phosphorus ions into said copper layer.

* * * * *